(12) United States Patent
Chen

(10) Patent No.: US 8,853,102 B2
(45) Date of Patent: Oct. 7, 2014

(54) MANUFACTURING METHOD OF CIRCUIT STRUCTURE

(71) Applicant: Ching-Sheng Chen, Hsinchu County (TW)

(72) Inventor: Ching-Sheng Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/961,844

(22) Filed: Aug. 7, 2013

(65) Prior Publication Data

US 2013/0323927 A1    Dec. 5, 2013

Related U.S. Application Data

(62) Division of application No. 13/160,501, filed on Jun. 14, 2011, now Pat. No. 8,552,303.

(30) Foreign Application Priority Data

May 4, 2011 (TW) .............................. 100115619 A

(51) Int. Cl.
*H01L 21/00* (2006.01)
*H05K 3/06* (2006.01)
*B82Y 10/00* (2011.01)
*H01L 21/768* (2006.01)

(52) U.S. Cl.
CPC ............ *H01L 21/7685* (2013.01); *H05K 3/062* (2013.01); *B82Y 10/00* (2013.01); *H05K 2201/0338* (2013.01)
USPC .......................................... 438/780; 438/687

(58) Field of Classification Search
CPC .................................................. H01L 21/7685
USPC .................................................. 438/780, 687
See application file for complete search history.

(56) References Cited

FOREIGN PATENT DOCUMENTS

TW    200927857    7/2009
TW    201130404    9/2011

OTHER PUBLICATIONS

"Office Action of Taiwan Counterpart Application", issued on Aug. 27, 2013, p. 1-p. 5.

*Primary Examiner* — Richard Booth
(74) *Attorney, Agent, or Firm* — Jianq Chyun IP Office

(57) ABSTRACT

A manufacturing method of a circuit structure is provided. A metal layer having an upper surface is provided. A surface passivation layer is formed on the metal layer. The surface passivation layer exposes a portion of the upper surface of the metal layer, and a material of the metal layer is different from a material of the surface passivation layer. The metal layer and the surface passivation layer are dipped into a modifier, and the modifier is selectively absorbed and attached to the surface passivation layer, so as to form a covering layer. The covering layer has a plurality of nanoparticles and covers the surface passivation layer.

7 Claims, 1 Drawing Sheet

MANUFACTURING METHOD OF CIRCUIT STRUCTURE

CROSS-REFERENCE TO RELATED APPLICATION

This application is a Divisional of and claims the priority benefit of U.S. application Ser. No. 13/160,501, filed on Jun. 14, 2011, now allowed, which claims the priority benefit of Taiwan application serial no. 100115619, filed on May 4, 2011. The entirety of each of the above-mentioned patent applications is hereby incorporated by reference herein and made a part of this specification.

BACKGROUND OF THE INVENTION

1. Field of the Invention

The invention relates to a circuit structure and a manufacturing method thereof. More particularly, the invention relates to a circuit structure capable of preventing Galvanic effects from occurring in an etching process or in any process that can lead to electrochemical reaction and a manufacturing method of the circuit structure.

2. Description of the Related Art

Circuit boards applied in the existing semiconductor package process have advantages of closed wiring, compact assembly, and favorable performance, the circuit boards have become one of the most applicable package devices. A circuit board can be assembled to a plurality of electronic components, e.g., chips, passive components, and so forth. The electronic components can be electrically connected by the circuit board, and thereby signals can be transmitted among the electronic components.

In most cases, the circuit board is formed by alternately stacking a plurality of patterned circuit layers and a plurality of dielectric layers. The patterned circuit layers are electrically connected through conductive blind holes or conductive vias. Here, the patterned circuit layers are mostly made of copper or copper alloy. Hence, in order to slow down or even preclude oxidation, a nickel gold layer, a nickel silver layer, or a nickel palladium gold layer that can act as a surface passivation layer is often formed on the outermost patterned circuit layer. Based on actual requirements, subsequent processes on the circuit board may be required. Since the patterned circuit layers made of copper or copper alloy and the noble metal (e.g., the gold layer or the silver layer) have different redox potential, when a wet etching process or a wet micro-etching process is subsequently performed, the patterned circuit layers serve as the anode, and the noble metal (e.g., the gold layer or the silver layer) serves as the cathode. This results in the well-known Galvanic cell effect. The patterned circuit layers made of copper or copper alloy are thus etched or dissolved in an accelerated manner. Thereby, the etching rate cannot be well managed for producing favorable etching result. Moreover, due to the expedited dissolution of the copper or the copper alloy, the copper or the copper alloy may not have the required thickness, such that the electrical quality of the circuit board may be deteriorated.

SUMMARY OF THE INVENTION

The invention is directed to a circuit structure and a manufacturing method thereof for preventing Galvanic effects from occurring in a subsequent etching process or in any process that can lead to electrochemical reaction.

In an embodiment of the invention, a manufacturing method of a circuit structure is provided. The manufacturing method includes following steps. A metal layer having an upper surface is provided. A surface passivation layer is formed on the metal layer. The surface passivation layer exposes a portion of the upper surface of the metal layer, and a material of the metal layer is different from a material of the surface passivation layer. The metal layer and the surface passivation layer are dipped into a modifier, and the modifier is attached to the surface passivation layer through chemical absorption, so as to form a covering layer. The covering layer has a plurality of nanoparticles and covers the surface passivation layer.

According to an embodiment of the invention, a thickness of the covering layer is less than 100 nm.

According to an embodiment of the invention, a material of the covering layer includes mercaptan nano-polymer or hydroxypropyl-beta-cyclodextrin.

According to an embodiment of the invention, a material of the metal layer includes copper or a copper alloy.

According to an embodiment of the invention, the surface passivation layer includes a nickel layer and a gold layer. The nickel layer is located between the metal layer and the gold layer, and the gold layer covers the nickel layer.

According to an embodiment of the invention, the surface passivation layer includes a nickel layer, a palladium layer, and a gold layer. The nickel layer is located between the metal layer and the palladium layer, and the gold layer covers the palladium layer.

According to an embodiment of the invention, the surface passivation layer includes a nickel layer and a silver layer. The nickel layer is located between the metal layer and the silver layer, and the silver layer covers the nickel layer.

According to an embodiment of the invention, the manufacturing method of the circuit structure further includes providing an insulation layer on a lower surface of the metal layer when the metal layer is provided. The lower surface is opposite to the upper surface.

In an embodiment of the invention, a circuit structure that includes a metal layer, a surface passivation layer, and a covering layer is provided. The metal layer has an upper surface. The surface passivation layer is configured on the upper surface of the metal layer. Here, the surface passivation layer exposes a portion of the upper surface of the metal layer, and a material of the metal layer is different from a material of the surface passivation layer. The covering layer is configured on the surface passivation layer. Here, the covering layer has a plurality of nanoparticles, and the covering layer covers the surface passivation layer.

According to an embodiment of the invention, a material of the covering layer includes mercaptan nano-polymer or hydroxypropyl-beta-cyclodextrin.

According to an embodiment of the invention, a thickness of the covering layer is less than 100 nm.

According to an embodiment of the invention, a material of the metal layer includes copper or a copper alloy.

According to an embodiment of the invention, the surface passivation layer includes a nickel layer and a gold layer. The nickel layer is located between the metal layer and the gold layer, and the gold layer covers the nickel layer.

According to an embodiment of the invention, the surface passivation layer includes a nickel layer, a palladium layer, and a gold layer. The nickel layer is located between the metal layer and the palladium layer, and the gold layer covers the palladium layer.

According to an embodiment of the invention, the surface passivation layer includes a nickel layer and a silver layer. The nickel layer is located between the metal layer and the silver layer, and the silver layer covers the nickel layer.

According to an embodiment of the invention, the circuit structure further includes an insulation layer that is configured on a lower surface of the metal layer. The lower surface is opposite to the upper surface.

Based on the above, in the manufacturing method of the circuit structure described in the embodiments of the invention, it is likely to form the covering layer that can be spontaneously attached to the surface passivation layer through chemical or physical absorption. Further, the Galvanic effects caused by the potential difference between two kinds of metals can be prevented when the subsequent processes are performed. Namely, the anode having the relatively high potential is dissolved in an accelerated manner. Accordingly, the circuit structure described in the embodiments of the invention can have favorable electrical quality.

Several exemplary embodiments accompanied with FIGURES are described in detail below to further describe the disclosure in details.

BRIEF DESCRIPTION OF THE DRAWINGS

The accompanying drawings are included to provide a further understanding, and are incorporated in and constitute a part of this specification. The drawings illustrate embodiments and, together with the description, serve to explain the principles of the disclosure.

DESCRIPTION OF EMBODIMENTS

Figure 1A:
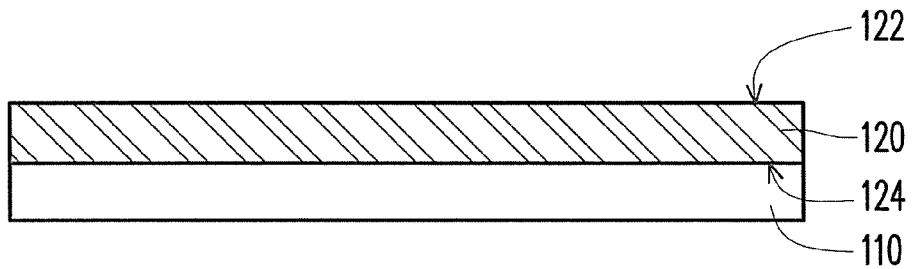
FIG. 1A to FIG. 1C are cross-sectional views illustrating a manufacturing method of a circuit structure according to an embodiment of the invention.
Figure 1B:
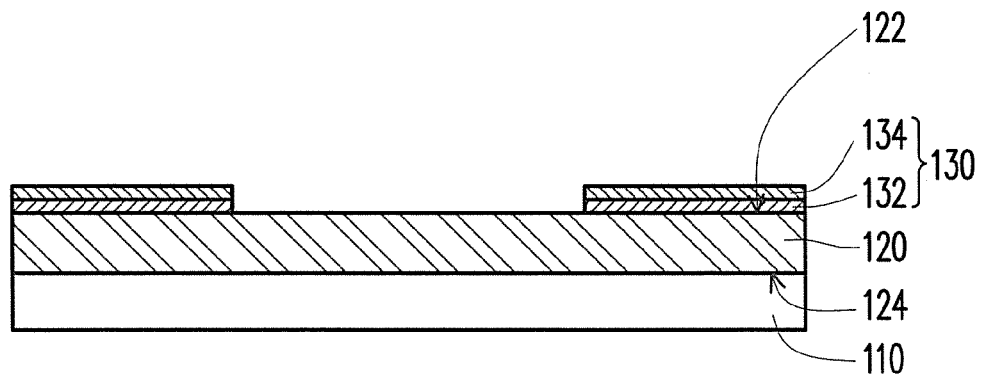
Figure 1C:
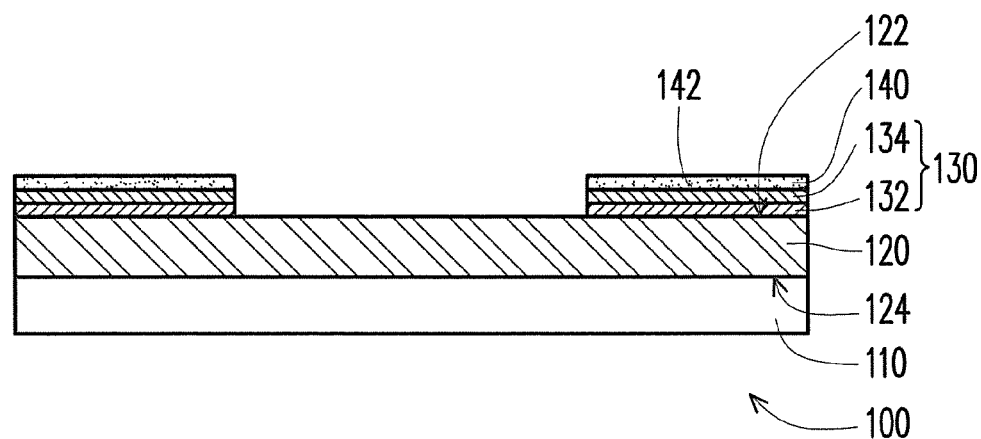

FIG. 1A to FIG. 1C are cross-sectional views illustrating a manufacturing method of a circuit structure according to an embodiment of the invention. With reference to FIG. 1A, in the manufacturing method of the circuit structure of this embodiment, an insulation layer 110 and a metal layer 120 are provided. The metal layer 120 has an upper surface 122 and a lower surface 124 opposite to the upper surface 122. The insulation layer 110 is configured on the lower surface 124 of the metal layer 120, so as to support the metal layer 120. According to this embodiment, the metal layer 120 is made of copper or a copper alloy, for instance.

With reference to FIG. 1B, a surface passivation layer 130 is formed on the metal layer 120. The surface passivation layer 130 exposes a portion of the upper surface 122 of the metal layer 120, and a material of the metal layer 120 is different from a material of the surface passivation layer 130. The surface passivation layer 130 of this embodiment is constituted by a nickel layer 132 and a gold layer 134, for instance. The nickel layer 132 is located between the metal layer 120 and the gold layer 134, and the gold layer 134 covers the nickel layer 132. In other embodiments that are not shown in the drawings, the surface passivation layer can also be constituted by a nickel layer and a silver layer, for instance. The nickel layer is located between the metal layer and the silver layer, and the silver layer covers the nickel layer. Alternatively, the surface passivation layer can also be constituted by a nickel layer, a palladium layer, and a gold layer. The nickel layer is located between the metal layer and the palladium layer, and the gold layer covers the palladium layer. That is to say, the surface passivation layer 130 herein is exemplary and should not be construed as a limitation to the invention. As long as the surface passivation layer 130 contains a metal layer made of noble metal, the surface passivation layer 130 does not depart from the scope of the invention for which protection is sought. Besides, note that a method of forming the surface passivation layer 130 includes electroplating.

With reference to FIG. 1C, the metal layer 120 and the surface passivation layer 130 are dipped into a modifier (not shown), and the modifier is selectively attached to the surface passivation layer 130 through chemical or physical absorption, so as to form a covering layer 140. In this embodiment, the covering layer 140 has a plurality of nanoparticles 142, and the covering layer 140 is tightly attached to the surface passivation layer 130. A thickness of the covering layer 140 is less than 100 nm, and the covering layer 140 is made of an organic material, such as mercaptan nano-polymer, hydroxypropyl-beta-cyclodextrin, and so on. So far, fabrication of the circuit structure 100 is substantially completed.

As indicated in FIG. 1C, the circuit structure 100 includes the insulation layer 110, the metal layer 120, the surface passivation layer 130, and the covering layer 140. The metal layer 120 has the upper surface 122 and the lower surface 124 opposite to the upper surface 122. The insulation layer 110 is configured on the lower surface 124 of the metal layer 120, so as to support the metal layer 120. The surface passivation layer 130 is configured on the upper surface 122 of the metal layer 120. Here, the surface passivation layer 130 exposes a portion of the upper surface 122 of the metal layer 120, and a material of the metal layer 120 is different from a material of the surface passivation layer 130. The covering layer 140 is configured on the surface passivation layer 130. Here, the covering layer 140 has a plurality of nanoparticles 142, and the covering layer 140 covers the surface passivation layer 130.

The redox potential of the metal layer 120 made of copper or copper alloy is different from the redox potential of the gold layer 134 or a silver layer (not shown) in the surface passivation layer 130, and therefore the potential difference between the two kinds of metals is likely to result in Galvanic effects in the subsequent processes. In this embodiment, the metal layer 120 and the surface passivation layer 130 are dipped into the modifier to from the covering layer 140 that can be spontaneously attached to the surface passivation layer 130 through chemical or physical absorption. Thereby, the physical characteristics (e.g., hydrophobicity/hydrophilicity or the liquid contacting angle) of the surface of the surface passivation layer 130 can be changed. As such, in the subsequent processes, the Galvanic effects can be effectively prevented from occurring in the circuit structure 100. Namely, the metal layer 120 is not excessively etched, and the etching rate or the dissolution rate of the copper layer can be effectively managed. Thereby, the etching result can be satisfactory, and the thickness of the copper layer can be well monitored. Consequently, the circuit structure 100 of this embodiment can have favorable electrical quality.

It should be mentioned that the circuit structure 100 depicted in FIG. 1C can be a single-side circuit board, a layer of circuit structure in a double-side circuit board, or a layer of circuit structure in a multi-layer circuit board. Here, the layer of circuit structure can be a surface circuit structure or an inner circuit structure, for instance. As such, based on the embodiments of the invention, the manufacturing method of the circuit structure can be applied to the process of fabricating the single-side circuit board, the double-side circuit board, or the multi-layer circuit board.

To sum up, by applying the manufacturing method of the circuit structure described in the embodiments of the invention, it is likely to form the covering layer that can be spontaneously attached to the surface passivation layer through chemical or physical absorption. Further, the Galvanic effects caused by the potential difference between two kinds of metals can be prevented when the subsequent processes are performed. Accordingly, the circuit structure described in the embodiments of the invention can have favorable electrical quality.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure provided they fall within the scope of the following claims and their equivalents.

What is claimed is:

1. A manufacturing method of a circuit structure, comprising:
    providing a metal layer, the metal layer having an upper surface;
    forming a surface passivation layer on the metal layer, the surface passivation layer exposing a portion of the upper surface of the metal layer, a material of the metal layer being different from a material of the surface passivation layer; and
    dipping the metal layer and the surface passivation layer into a modifier, the modifier being attached to the surface passivation layer through absorption, so as to form a covering layer, the covering layer having a plurality of nanoparticles and covering the surface passivation layer, wherein a material of the covering layer comprises mercaptan nano-polymer or hydroxypropyl-beta-cyclodextrin.

2. The manufacturing method as recited in claim 1, wherein a thickness of the covering layer is less than 100 nm.

3. The manufacturing method as recited in claim 1, wherein the material of the metal layer comprises copper or a copper alloy.

4. The manufacturing method as recited in claim 1, wherein the surface passivation layer comprises a nickel layer and a gold layer, the nickel layer is located between the metal layer and the gold layer, and the gold layer covers the nickel layer.

5. The manufacturing method as recited in claim 1, wherein the surface passivation layer comprises a nickel layer, a palladium layer, and a gold layer, the nickel layer is located between the metal layer and the palladium layer, and the gold layer covers the palladium layer.

6. The manufacturing method as recited in claim 1, wherein the surface passivation layer comprises a nickel layer and a silver layer, the nickel layer is located between the metal layer and the silver layer, and the silver layer covers the nickel layer.

7. The manufacturing method as recited in claim 1, further comprising:
    providing an insulation layer on a lower surface of the metal layer when the metal layer is provided, the lower surface being opposite to the upper surface.

* * * * *